(12) United States Patent
Kusunoki et al.

(10) Patent No.: US 9,732,441 B2
(45) Date of Patent: Aug. 15, 2017

(54) PRODUCTION APPARATUS AND PRODUCTION METHOD OF SiC SINGLE CRYSTAL

(75) Inventors: Kazuhiko Kusunoki, Tokyo (JP); Kazuhito Kamei, Tokyo (JP); Nobuyoshi Yashiro, Tokyo (JP); Nobuhiro Okada, Tokyo (JP); Hironori Daikoku, Susono (JP); Motohisa Kado, Susono (JP); Hidemitsu Sakamoto, Susono (JP)

(73) Assignees: NIPPON STEEL & SUMITOMO METAL CORPORATION, Tokyo (JP); TOYOTA JIDOSHA KABUSHIKI KAISHA, Aichi (JP)

( * ) Notice: Subject to any disclaimer, the term of this patent is extended or adjusted under 35 U.S.C. 154(b) by 208 days.

(21) Appl. No.: 14/125,625

(22) PCT Filed: Jun. 15, 2012

(86) PCT No.: PCT/JP2012/065420
§ 371 (c)(1),
(2), (4) Date: Dec. 12, 2013

(87) PCT Pub. No.: WO2012/173251
PCT Pub. Date: Dec. 20, 2012

(65) Prior Publication Data
US 2014/0116324 A1    May 1, 2014

(30) Foreign Application Priority Data
Jun. 17, 2011  (JP) .................... 2011-135108

(51) Int. Cl.
*C30B 9/00* (2006.01)
*C30B 35/00* (2006.01)
(Continued)

(52) U.S. Cl.
CPC ............... *C30B 35/00* (2013.01); *C30B 9/10* (2013.01); *C30B 11/003* (2013.01); *C30B 15/32* (2013.01);
(Continued)

(58) Field of Classification Search
CPC   C30B 29/36; C30B 15/32; C30B 9/10; C30B 35/00
(Continued)

(56) References Cited

U.S. PATENT DOCUMENTS

| 4,613,486 A * | 9/1986 | Tatsumi ................. C30B 15/32 117/217 |
| 2008/0190358 A1 * | 8/2008 | Radkevich ............. C30B 15/32 117/208 |
| 2010/0288188 A1 * | 11/2010 | Terashima ............. C30B 15/00 117/73 |

FOREIGN PATENT DOCUMENTS

| EP | 0144512 | 6/1985 |
| EP | 2319963 | 5/2011 |

(Continued)

OTHER PUBLICATIONS

Japan Platform for Patent Information, English Computer translation of JP 2006-131433 A (2015).*

(Continued)

*Primary Examiner* — Matthew Song
(74) *Attorney, Agent, or Firm* — Clark & Brody

(57) ABSTRACT

An apparatus for producing an SiC single crystal includes a crucible for accommodating an Si—C solution and a seed shaft having a lower end surface where an SiC seed crystal (36) would be attached. The seed shaft includes an inner pipe that extends in a height direction of the crucible and has a first passage. An outer pipe accommodates the inner pipe and constitutes a second passage between itself and the inner pipe and has a bottom portion whose lower end surface
(Continued)

covers a lower end opening of the outer pipe. One passage of the first and second passages serves as an introduction passage where coolant gas flows downward, and the other passage serves as a discharge passage where coolant gas flows upward. A region inside the pipe that constitutes the introduction passage is to be overlapped by a region of not less than 60% of the SiC seed crystal.

2 Claims, 7 Drawing Sheets

(51) Int. Cl.
| | |
|---|---|
| *C30B 9/10* | (2006.01) |
| *C30B 29/36* | (2006.01) |
| *C30B 15/32* | (2006.01) |
| *C30B 17/00* | (2006.01) |
| *C30B 11/00* | (2006.01) |
| *C30B 19/06* | (2006.01) |
| *C30B 19/08* | (2006.01) |

(52) U.S. Cl.
CPC ............ *C30B 17/00* (2013.01); *C30B 19/068* (2013.01); *C30B 19/08* (2013.01); *C30B 29/36* (2013.01); *Y10T 117/1068* (2015.01); *Y10T 117/1092* (2015.01)

(58) Field of Classification Search
USPC .............................. 117/73, 911, 41, 64, 208
See application file for complete search history.

(56) References Cited

FOREIGN PATENT DOCUMENTS

| JP | 63176388 A | * | 7/1988 | ............ C30B 15/00 |
|---|---|---|---|---|
| JP | 03-183690 | | 8/1991 | |
| JP | 2006131433 A | * | 5/2006 | |
| JP | 2006-169073 | | 6/2006 | |
| JP | 2011-051857 | | 3/2011 | |
| JP | 2011-098871 | | 5/2011 | |

OTHER PUBLICATIONS

Belruss V. et al., "Top-seeded solution . . . non-stoichiometric melts", Materials Research Bulletin, Elsevier, Kidlington, GB, vol. 6, No. 10, Oct. 1, 1971, pp. 899-905.

Belruss V. et al., "Top-seeded solution . . . non-stoichiometric melts", Materials Research Bulletin, vol. 6, No. 10, Oct. 1, 1971, pp. 899-906.

Jacquier C. et al., "On the growth . . . Al rich Al—Si melts", Journal of Crystal Growth, Elsevier, Amsterdam, NL, vol. 254, No. 1-2, Jun. 1, 2003, pp. 123-130.

* cited by examiner

PRODUCTION APPARATUS AND PRODUCTION METHOD OF SIC SINGLE CRYSTAL

TECHNICAL FIELD

The present invention relates to a production apparatus of an SiC single crystal, and more particularly to a production apparatus of an SiC single crystal by a solution growth method.

BACKGROUND ART

The solution growth method has been known as a method for producing a single crystal of silicon carbide (SiC). In the solution growth method, an SiC single crystal is grown on an SiC seed crystal which is in contact with an Si—C solution. The Si—C solution is a solution in which carbon (C) is dissolved into a melt of Si or an Si alloy. It is desirable that carbon is dissolved in the solution as much as possible within a composition range in which the solution and the solid phase SiC are at thermodynamic equilibrium. The SiC seed crystal is brought into contact with the Si—C solution (a liquid phase) such that at least a portion of the solution in the vicinity of the seed crystal is supercooled. This creates a supersaturated condition of SiC in the portion of the solution in the vicinity of the seed crystal, thereby causing an SiC single crystal to grow on the seed crystal.

A general method for creating a supersaturated condition is a so-called temperature difference method. In the temperature difference method, a temperature gradient is provided in the solution such that the temperature of a region in the vicinity of the seed crystal in the solution is lower than the temperature of other portions of the solution.

In the production methods of a single crystal disclosed in JP03-183690A (Patent Literature 1) and JP2006-169073A (Patent Literature 2), a seed crystal is cooled by feeding a gas into a seed shaft with the seed crystal attached. In the production methods disclosed in these literatures, the temperature of a portion in the vicinity of the seed crystal in the solution is made lower than in other portions of the solution by cooling the seed crystal.

DISCLOSURE OF THE INVENTION

However, it is difficult to efficiently cool the seed crystal simply by feeding a gas into the seed shaft.

It is an object of the present invention to provide a production apparatus of an SiC single crystal which is capable of efficiently cooling a seed crystal attached to a seed shaft.

A production apparatus of an SiC single crystal according to an embodiment of the present invention includes a crucible and a seed shaft. The crucible accommodates an Si—C solution. The seed shaft has a lower end surface to which an SiC seed crystal is to be attached. The seed shaft includes an inner pipe, an outer pipe, and a bottom portion. The inner pipe constitutes a first passage thereinside. The outer pipe accommodates the inner pipe, and constitutes a second passage between itself and the inner pipe. The bottom portion covers a lower end opening of the outer pipe and has the lower end surface. One of the first and second passages serves as an introduction passage through which a coolant gas flows downward, and the other passage serves as a discharge passage in which the coolant gas flows upward. Viewing from the axial direction of the seed shaft, a region inside the pipe that constitutes the introduction passage is to be overlapped by a region of not less than 60% of the SiC seed crystal.

A production apparatus of an SiC single crystal according to an embodiment of the present invention can efficiently cool a seed crystal attached to a seed shaft.

DESCRIPTION OF EMBODIMENTS

Figure 1:
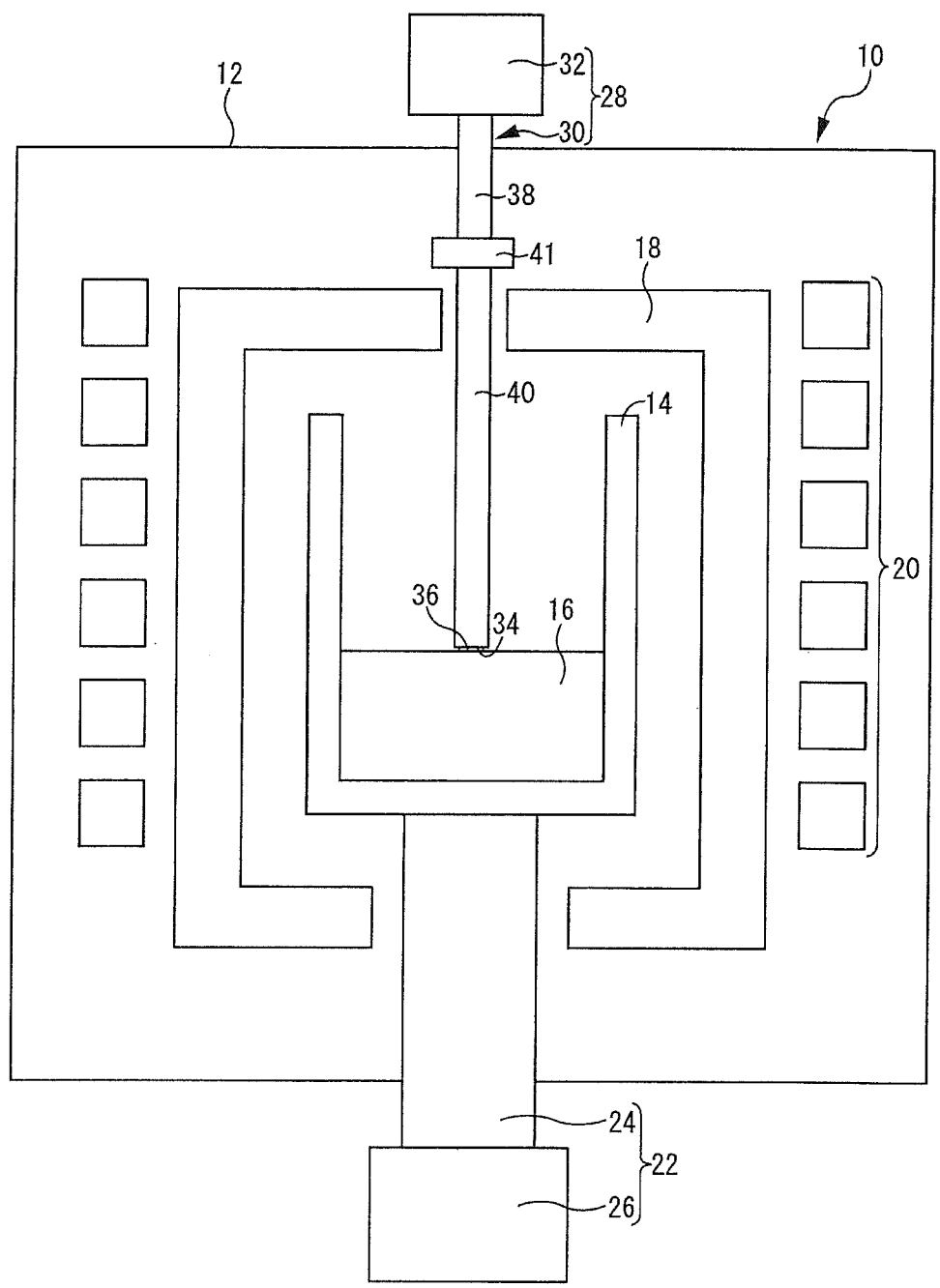
FIG. 1 is a schematic view of a production apparatus of an SiC single crystal according to a first embodiment of the present invention.

A production apparatus of an SiC single crystal according an embodiment of the present invention includes a crucible, and a seed shaft. The crucible accommodates an Si—C solution. The seed shaft has a lower end surface to which an SiC seed crystal is to be attached. The seed shaft includes an inner pipe, an outer pipe, and a bottom portion. The inner pipe constitutes a first passage thereinside. The outer pipe accommodates the inner pipe, and constitutes a second passage between itself and the inner pipe. The bottom portion covers a lower end opening of the outer pipe, and has the lower end surface. One passage of the first and second passages serves as an introduction passage in which a coolant gas flows downward, and the other passage serves as a discharge passage in which the coolant gas flows upward. Viewing from the axial direction of the seed shaft, a region inside the pipe that constitutes the introduction passage is to be overlapped by a region of not less than 60% of the SiC seed crystal.

A major portion of the SiC seed crystal when viewed from the axial direction of the seed shaft is located below the region inside the pipe that constitutes the introduction passage. For example, when the introduction passage is formed inside the inner pipe, viewed from the axial direction of the seed shaft, a major portion of the SiC seed crystal is located below a region inside the inner pipe. When the introduction passage is formed between the inner pipe and the outer pipe, viewed from the axial direction of the seed shaft, a major portion of the SiC seed crystal is located below a region inside the outer pipe. Therefore, the bottom portion (especially, an attachment region of the SiC seed crystal) of the seed shaft is efficiently cooled. Consequently, the SiC seed crystal is efficiently cooled.

The inner pipe preferably has a heat insulating property. In the present embodiment, the coolant gas flows from the introduction passage toward the bottom portion to hit the bottom portion. The coolant gas takes away the heat of the bottom portion, thereby cooling the bottom portion. The coolant gas that has taken away heat from the bottom portion flows through the discharge passage. In the description below, the coolant gas before it takes away the heat of the bottom portion is referred to as a "gas before use", and the coolant gas after it has taken away the heat of the bottom portion is referred to as a "gas after use". When the inner pipe has a heat insulating property, the heat of the gas after use can be prevented from being transferred to the gas before use through the inner pipe. Consequently, the bottom portion is efficiently cooled by the coolant gas.

Preferably, a lower end of the inner pipe is disposed apart from the bottom portion. In this case, the coolant gas is more likely to come into contact with the entire bottom portion. Consequently, the bottom portion is more efficiently cooled by the coolant gas.

In the present embodiment, as described above, one passage of the first and second passages is an introduction passage in which the coolant gas flows downward. When an introduction passage is formed inside the inner passage, viewing from the axial direction of the seed shaft, a major portion of the SiC seed crystal is located below a region inside the inner pipe. Therefore, it is possible to prevent a radiation heat dissipation of the bottom portion from being hindered by the inner pipe. Consequently, the bottom portion is furthermore efficiently cooled.

When the introduction passage is formed between the inner and outer pipes, it is possible to adopt a larger SiC seed crystal compared with a case in which the introduction passage is formed inside the inner pipe.

A method for producing an SiC single crystal according to an embodiment of the present invention utilizes the above described production apparatus.

Hereafter, more specific production apparatuses of an SiC single crystal according to embodiments will be described with reference to the drawings. The same or corresponding parts in the drawings will be denoted by the same reference characters, and description thereof will not be repeated.

[First Embodiment]

FIG. 1 is a configuration diagram of a production apparatus 10 of an SiC single crystal according to a first embodiment of the present invention.

[Production Apparatus]

Referring to FIG. 1, the production apparatus 10 includes a chamber 12. The chamber 12 accommodates a crucible 14. When an SiC single crystal is produced, the chamber 12 is water cooled.

The crucible 14 accommodates an Si—C solution 16. The Si—C solution 16 is a raw material for the SiC single crystal. The Si—C solution 16 contains silicon (Si) and carbon (C).

The Si—C solution 16 may be produced, for example, by heating a single substance of Si or a mixture of Si and other metal elements into a melt, and dissolving carbon (C) into the melt. Examples of the other metal elements include titanium (Ti), manganese (Mn), chromium (Cr), cobalt (Co), vanadium (V), iron (Fe), and so on. Among these metal elements, preferable metal elements are Ti, Cr, and Fe. Further preferable metal elements are Ti and Cr.

Preferably, the crucible 14 contains carbon. The crucible 14 may be, for example, made of graphite or SiC. The crucible 14 may be coated with SiC on the inner surface thereof. This will allows the crucible 14 to serve as a carbon source to the Si—C solution 16.

The chamber 12 further accommodates a heat insulation member 18. The heat insulation member 18 is disposed so as to surround the crucible 14. In other words, the heat insulation member 18 accommodates the crucible 14.

The chamber 12 further accommodates a heating apparatus 20. The heating apparatus 20 is, for example, a high-frequency coil. The heating apparatus 20 is disposed so as to surround a side wall of the heat insulation member 18. In other words, the heat insulation member 18 and the crucible 14 are inserted into the heating apparatus 20.

The heating apparatus 20 inductively heats the crucible 14 to melt the raw material accommodated in the crucible 14. This results in the production of the Si—C solution 16.

The heating apparatus 20 maintains the Si—C solution 16 at a crystal growth temperature. The crystal growth temperature depends on the composition of the Si—C solution 16. A typical crystal growth temperature is 1600 to 2000° C.

The production apparatus 10 further includes a rotating apparatus 22. The rotating apparatus 22 includes a rotating shaft 24 and a driving source 26.

The rotating shaft 24 extends in a height direction of the chamber 12 (a vertical direction in FIG. 1). An upper end of the rotating shaft 24 is located within the heat insulation member 18. The crucible 14 is disposed at the upper end of the rotating shaft 24. A lower end of the rotating shaft 24 is located outside the chamber 12. The rotating shaft 24 is connected to the driving source 26.

The driving source 26 is disposed below the chamber 12. When an SiC single crystal is produced, the driving source 26 rotates the rotating shaft 24 around its central axis. This causes the crucible 14 to rotate.

The production apparatus 10 further includes a hoisting unit 28. The hoisting unit 28 includes a seed shaft 30 and a driving source 32.

The seed shaft 30 extends in a height direction of the chamber 12. An upper end of the seed shaft 30 is located outside the chamber 12. The seed shaft 30 is connected to the driving source 32.

The driving source 32 is disposed above the chamber 12. The driving source 32 causes the seed shaft 30 to go up and down. The driving source 32 further causes the seed shaft 30 to rotate around its central axis.

A lower end of the seed shaft 30 is located within the crucible 14. An SiC seed crystal 36 is attached to a lower end surface 34 of the seed shaft 30.

The SiC seed crystal 36 is plate-shaped. In the present example, the SiC seed crystal 36 is disc-shaped. However, the shape of the SiC seed crystal 36 will not be particularly limited to a disc shape. The shape of the SiC seed crystal 36 may be polygonal, such as, for example, hexagonal and rectangular.

The SiC seed crystal 36 is made up of an SiC single crystal. Preferably, the crystal structure of the SiC seed crystal 36 is the same as that of the SiC single crystal to be produced. For example, when an SiC single crystal having 4H polymorphism is produced, an SiC seed crystal having 4H polymorphism is utilized. When an SiC seed crystal 36 having 4H polymorphism is utilized, the surface of the SiC seed crystal 36 is preferably a (0001) plane or a plane inclined by an angle of not more than 8° from the (0001) plane. In such a case, the SiC single crystal will stably grow.

[Configuration of Seed Shaft]

Figure 2:
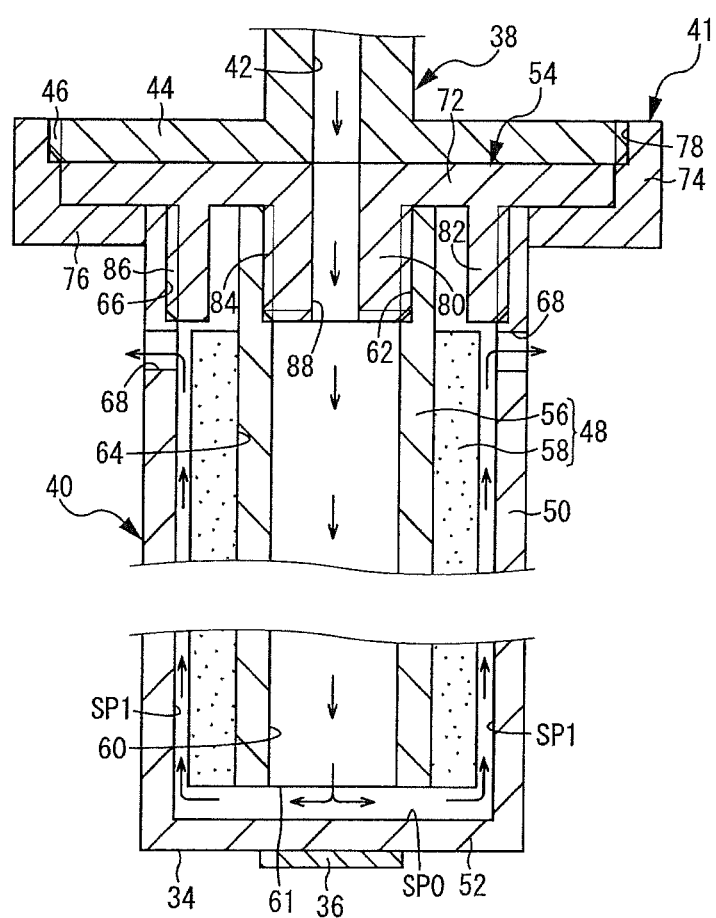
FIG. 2 is a longitudinal sectional view of a seed shaft in FIG. 1.

FIG. 2 is a longitudinal sectional view of the seed shaft 30 in FIG. 1. As shown in FIGS. 1 and 2, the seed shaft 30 includes a shaft 38, a shaft 40, and a connection member 41. The shaft 38 is disposed above the shaft 40, and is coaxially disposed with the shaft 40. The connection member 41 is disposed between the shaft 38 and the shaft 40 and connects the shaft 38 with the shaft 40.

The shaft 38 extends in a height direction of the chamber 12. The shaft 38 includes a passage (not shown) through which a coolant water flows. In short, the shaft 38 is cooled by the coolant water.

The shaft 38 further includes an introduction hole 42. The introduction hole 42 is formed in the shaft 38, and extends in the axial direction of the shaft 38. The introduction hole 42 guides a cooling gas to the shaft 40.

The coolant gas is provided to the introduction hole 42 from outside the production apparatus 10. The coolant gas flows along the axial direction in the shaft 40, and cools the lower end of the shaft 40. The kind of the coolant gas is selected from a viewpoint of cooling efficiency and the like. For example, the coolant gas is helium gas which has a high heat conductivity.

A flange 44 is provided at a lower end of the shaft 38. The flange 44 is disc-shaped and has a thread ridge 46 on its outer peripheral surface. The flange 44 joins the shaft 38 with the shaft 40.

The shaft 40 includes an inner pipe 48, an outer pipe 50, a bottom portion 52, and a support member 54. The inner pipe 48, the outer pipe 50 and the bottom portion 52 constitute a passage of coolant gas. The support member 54 suspends the outer pipe 50 and the inner pipe 48. The support member 54 is further used to join the shaft 40 with the shaft 38.

To be specific, the inner pipe 48 includes a base pipe 56 and a heat insulation pipe 58. The base pipe 56 is made of a heat resistant material. The heat resistant material is, for example, graphite and the like. The base pipe 56 is a cylinder, and has a hole 60 extending in its axial direction. A thread groove 62 is formed at an upper end portion of the hole 60.

The heat insulation pipe 58 is made of a heat insulation material. The heat insulation material is, for example, alumina, zirconia, pyrolytic carbon, graphite sheet, and the like. As the heat insulation pipe 58, a molded heat insulation material may be used. The heat insulation pipe 58 is disposed on an outer peripheral surface of the base pipe 56. In the present example, the heat insulation pipe 58 is cylinder-shaped, and has a hole 64 extending in its axial direction. An inner peripheral surface of the heat insulation pipe 58 adheres closely to the outer peripheral surface of the base pipe 56.

The outer pipe 50 is a cylinder. A thread groove 66 is formed in an upper end portion of an inner peripheral surface of the outer pipe 50. A plurality of discharge holes 68 are formed in a portion, which is located lower than the thread groove 66, of an upper end portion of the outer pipe 50. The plurality of discharge holes 68 are, for example, disposed spaced apart from each other in a circumferential direction of the outer pipe 50. The discharge holes 68 discharge the coolant gas, which has cooled a lower end of the seed shaft 30, (that is, gas after use) to the outside.

The bottom portion 52 is disc-shaped, and covers an opening at a lower end of the outer pipe 50. In the present embodiment, the bottom portion 52 is integrally formed with the outer pipe 50. However, the bottom portion 52 may also be a separate member from the outer pipe 50. The bottom portion 52 has a lower end surface 34. The SiC seed crystal 36 is attached to the lower end surface 34.

Each of the outer pipe 50 and the bottom portion 52 is made of a heat resistant material. The heat resistant material is, for example, graphite and the like.

The support member 54 includes a flange 72, a ring portion 80, and a ring portion 82. The support member 54 is made of a heat resistant material such as graphite, and the like.

The flange 72 is disc-shaped. The flange 72 overlaps the flange 44. That is, an upper surface of the flange 72 is in contact with a lower surface of the flange 44.

The connection member 41 is made of a heat resistant material, and connects the flange 72 with the flange 44. The connection member 41 includes a ring portion 74 and a bottom cover portion 76 having a through hole in its center. The bottom cover portion 76 is disc-shaped. A thread groove 78 is formed in an inner peripheral surface of an upper end portion of the ring portion 74. The ring portion 74 and the bottom cover portion 76 are integrally formed. The connection member 41 is attached to the flange 44 by means of the thread groove 78 and the thread ridge 46. At this moment, the flange 72 is secured by being placed between the bottom cover portion 76 and the flange 44. As so far described, the support member 54 is joined to a lower end of the shaft 38 by the connection member 41.

The support member 54 is further joined with an upper end of the shaft 40. To be specific, ring portions 80 and 82 are provided in a lower surface of the flange 72 of the support member 54. The ring portion 80 is provided in a central portion of the lower surface of the flange 72. A thread ridge 84 is formed in an outer peripheral surface of the ring portion 80. The ring portion 82 is disposed around the ring portion 80, and coaxially with the ring portion 80. A thread ridge 86 is formed in an outer peripheral surface of the ring portion 82. The support member 54 has a through hole 88 which extends in a vertical direction, in its central portion. The through hole 88 constitutes an inner peripheral surface of the ring portion 80.

The support member 54 joins with an upper end of the inner pipe 48 and an upper end of the outer pipe 50. To be specific, the ring portion 80 is attached to the upper end of the inner pipe 48 by means of the thread ridge 84 and the thread groove 62. The ring portion 82 is attached to the upper end of the outer pipe 50 by means of the thread ridge 86 and the thread groove 66.

As so far described, the support member 54 suspends the inner pipe 48 and the outer pipe 50. At this moment, a lower end of the inner pipe 48 (the lower ends of the base pipe 56 and the heat insulation pipe 58) is disposed apart from an upper surface of the bottom portion 52. Therefore, a gap SP0 is formed between the lower end of the inner pipe 48 and the upper surface of the bottom portion 52.

An outer diameter of the inner pipe 48 (that is, the outer diameter of the heat insulation pipe 58) is smaller than an inner diameter of the outer pipe 50. For that reason, a gap SP1 is formed between an outer peripheral surface of the inner pipe 48 (an outer peripheral surface of the heat insulation pipe 58) and an inner peripheral surface of the outer pipe 50. The hole 60 of the inner pipe 48, and the gaps SP0 and SP1 provide a passage through which a coolant gas flows. Therefore, the inner pipe 48 constitutes, along with the outer pipe 50, a passage for a coolant gas.

As so far described, the shaft 38 and the shaft 40 are coaxially connected by means of the connection member 41. And the introduction hole 42, the through hole 88, and the hole 60 coaxially join with each other. Therefore, the coolant gas that flows downward in the introduction hole 42 flows to the hole 60 via the through hole 88. Thus, in FIG. 2, the hole 60 provides an introduction passage (a first passage) through which the coolant gas (gas before use) flows downward.

The gas before use flows downward in the introduction passage (the hole 60), and is blown against the upper surface of the bottom portion 52 from an opening 61 of the inner pipe 48. The gas before use which has been blown against the upper surface of the bottom portion 52 cools the bottom portion 52 and takes away heat from the bottom portion 52 while an SiC single crystal is produced. The coolant gas (gas after use) which has finished cooling the bottom portion 52 flows from the gap SP0 into the gap SP1. The gas after use flows upward through the gap SP1 and is discharged to the outside of the shaft 40 through the discharge holes 68. Therefore, in FIG. 2, the gap SP1 provides a discharge passage (a second passage) through which the gas after use flows.

According to the above described configuration, the seed shaft 30 constitutes an introduction passage 60 and a discharge passage SP1. While an SiC single crystal is produced, the SiC seed crystal 36 attached to a lower surface of the bottom portion 52 is cooled by the gas before use which flows through the introduction passage 60. The gas after use which has taken away heat from the bottom portion 52 and the SiC seed crystal 36 flows through the discharge passage SP1 to be quickly discharged to the outside. Thus, the production apparatus 10 cools the SiC seed crystal 36.

Since the inner pipe 48 is disposed between the introduction passage 60 and the discharge passage SP1, the gas before use that flows through the introduction passage 60 is not likely to come into contact with the gas after use that flows in the discharge passage SP1. Therefore, it is possible to prevent the gas before use from being warmed by the gas after use. Consequently, the SiC seed crystal 36 is efficiently cooled.

Particularly, in the present embodiment, the inner pipe 48 has a heat insulating property due to the heat insulation pipe 58. Therefore, the heat of the gas after use is insulated by the inner pipe 48 and is not likely to be transferred to the gas before use. Consequently, the SiC seed crystal 36 is cooled more efficiently.

Further, a gap SP0 is formed between a lower end surface of the inner pipe 48 and the upper surface of the bottom portion 52. The SP0 allows the coolant gas to be blown against the entire upper surface of the bottom portion 52, thereby increasing the cooling efficiency of the bottom portion 52. Thus, the SiC seed crystal 36 attached to the bottom portion 52 is efficiently cooled.

Further, since the gas after use which has been warmed by the bottom portion 52 flows through the gap SP1, it is possible to prevent the outer pipe 50 from being excessively cooled.

[Relative Arrangement Between Opening of Introduction Passage and SiC Seed Crystal]

Figure 3:
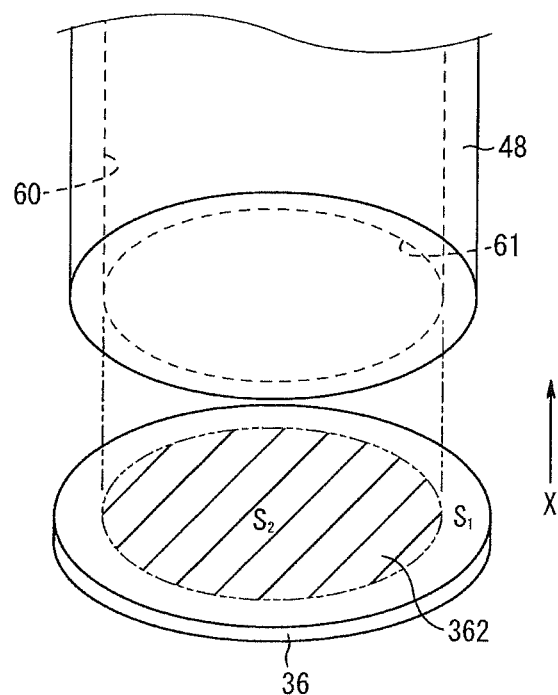
FIG. 3 is a perspective view showing the relationship between an inner pipe shown in FIG. 2 and an SiC seed crystal.

Further, as shown in FIG. 3, when the seed shaft 30 is viewed from an axial direction X, the opening 61 of the inner pipe 48 having an introduction passage 60 (that is, a region inside the inner pipe 48) overlaps a major part of the SiC seed crystal 36. In other words, the opening 61 is not excessively small with respect to the SiC seed crystal 36. For that reason, the coolant gas that has flown out from the introduction passage 60 can cool substantially the whole of the SiC seed crystal 36. Consequently, the SiC seed crystal 36 is efficiently cooled.

The clause "the opening 61 is not excessively small with respect to the SiC seed crystal 36" means that the SiC seed crystal 36 and the opening 61 satisfy the following relationship. As shown in FIG. 3, a case is assumed in which the size of the SiC seed crystal 36 when viewed from the axial direction X is larger than the opening 61. Let the area of the SiC seed crystal 36 viewed from the axial direction X be $S_1$. Then, let the area of a region 362 of the opening 61, which overlaps the SiC seed crystal 36, be $S_2$. In this case, the area $S_1$ of the SiC seed crystal 36 satisfies the following Formula (1) with respect to the area $S_2$ in which the opening 61 and the SiC seed crystal 36 overlap.

$$S_2/S_1 \geq 0.60 \tag{1}$$

When the SiC seed crystal 36 satisfies Formula (1) with respect to the opening 61, that is, a region of not less than 60% of the SiC seed crystal 36 overlaps the opening 61 when viewed from the axial direction X, the opening 61 is not excessively small with respect to the SiC seed crystal 36. In this case, it is possible to dissipate the heat of the substantially whole of the SiC seed crystal 36 by blowing the gas before use that flows through the introduction passage 60 against the bottom portion 52. Further, since a major portion of the SiC seed crystal 36 is located below the opening 61 which is a spout of the coolant gas, it is possible to prevent the inner pipe 48 from obstructing the heat dissipation through radiation of the bottom portion 52. As so far described, the SiC seed crystal 36 is efficiently cooled.

When the opening 61 is excessively small with respect to the SiC seed crystal 36, that is, when only a region of less than 60% of the SiC seed crystal 36, viewed from the axial direction X, overlaps the opening 61, the region of the SiC seed crystal 36 against which the gas before use is blown is excessively small. Further, the heat dissipation through radiation of the bottom portion 52 is obstructed by the inner pipe 48. Therefore, the cooling efficiency of the SiC seed crystal 36 deteriorates.

As so far described, the inner pipe 48 and the outer pipe 50 allows the seed shaft 30 to have the introduction passage 60 and the discharge passage SP1. The seed shaft 30 blows the gas before use against the bottom portion 52 through the introduction passage 60. The seed shaft 30 further causes the gas after use which has taken away the heat of the bottom portion 52 to flow upward through the discharge passage SP1 and to be discharged to the outside. Thereby, it is possible to inhibit the gas after use, which has taken away heat, from mixing with the gas before use, thereby improving the cooling efficiency of the SiC seed crystal 36.

Further, as described above, viewed from the axial direction of the seed shaft 30, a region of not less than 60% of the SiC seed crystal 36 overlaps the opening 61 of the introduction passage 60. To be specific, Formula (1) is satisfied. Thus, the gas before use which flows through the introduction passage 60 cools the substantially whole of the SiC seed crystal 36. Further, a major part of the SiC seed crystal 36 is located below the opening 61 which is a spout of the coolant gas. Therefore, it is possible to prevent the inner pipe 48 from obstructing the heat dissipation through radiation of the bottom portion 52. As so far described, the cooling efficiency of the bottom portion 52 can be increased.

In the present embodiment, the shaft 40 is connected to the shaft 38. This makes it possible to increase the cooling efficiency as the whole of the seed shaft 30.

Further, the plurality of discharge holes 68 formed in the outer pipe 50 are located above the heat insulation member 18. Therefore, while an SiC single crystal is produced, the gas after use (discharged gas) which is discharged from the discharge holes 68 is not likely to enter inside the heat insulation member 18, and the discharged gas is less likely to affect the growth of the SiC single crystal.

[Method for Producing SiC Single Crystal]

A method for producing an SiC single crystal by using the production apparatus 10 will be described. As described above, the production apparatus 10 efficiently cools the SiC seed crystal 36. Therefore, a region of the Si—C solution 16 in the vicinity of the SiC seed crystal 36 is easily supercooled. This makes an SiC single crystal easier to grow on the SiC seed crystal 36, thereby increasing a crystal growth rate.

In the method for producing an SiC single crystal, first, the production apparatus 10 is prepared and the SiC seed crystal 36 is attached to the seed shaft 30 (providing step). Next, the crucible 14 is disposed in the chamber 12 and the Si—C solution 16 is produced (Si—C solution production step). Next, the SiC seed crystal 36 is brought into contact with the Si—C solution 16 in the crucible 14 (contacting step). Next, the SiC single crystal is grown (growth step). Hereafter, details of each step will be described.

[Providing Step]

First, the production apparatus 10 including the seed shaft 30 is prepared. Then, the SiC seed crystal 36 is attached to a lower end surface 34 of the seed shaft 30. The attachment position of the SiC seed crystal 36 satisfies the above described Formula (1). That is, viewed from the axial direction X, the SiC seed crystal 36 is attached to the lower end surface 34 such that a region of not less than 60% of the SiC seed crystal 36 overlaps the opening 61 of the inner pipe 48 including the introduction passage 60.

[Si—C Solution Production Step]

Next, the crucible 14 is disposed on the rotating shaft 24 in the chamber 12. The crucible 14 accommodates the raw material of the Si—C solution 16.

Next, the Si—C solution 16 is produced. First, an inert gas is filled in the chamber 12. Then, the raw material of the Si—C solution 16 in the crucible 14 is heated to not lower than a melting point by the heating apparatus 20. When the crucible 14 is made of graphite, heating the crucible 14 causes carbon to dissolve in the melt from the crucible 14, thereby forming the Si—C solution 16. When the carbon of the crucible 14 dissolves into the Si—C solution 16, the carbon concentration in the Si—C solution 16 approaches a saturated concentration.

[Contacting Step]

Next, the SiC seed crystal 36 is brought into contact with the Si—C solution 16. To be specific, the seed shaft 30 is moved down by the driving source 32 so that the SiC seed crystal 36 is brought into contact with the Si—C solution 16.

[Growth Step]

After the SiC seed crystal 36 is brought into contact with the Si—C solution 16, the Si—C solution 16 is retained at a crystal growth temperature by the heating apparatus 20. Further, a region of the Si—C solution 16 in the vicinity of the SiC seed crystal 36 is supercooled so that SiC becomes supersaturated. To be specific, a coolant gas is caused to flow in the seed shaft 30 to cool the bottom portion 52 with the SiC seed crystal 36 attached. If the bottom portion 52 is cooled, the SiC seed crystal 36 will be cooled as well. Consequently, the vicinity of the SiC seed crystal 36 will be cooled as well. If the region in the vicinity of the SiC seed crystal 36 becomes supercooled, the SiC concentration will increase to be supersaturated.

The SiC seed crystal 36 and the Si—C solution 16 are rotated while SiC in the region in the vicinity of the SiC seed crystal 36 is kept on being supersaturated. Rotating the seed shaft 30 causes the SiC seed crystal 36 to rotate. Rotating the rotating shaft 24 causes the crucible 14 to rotate. The rotation direction of the SiC seed crystal 36 may be the same as or opposite to the rotation direction of the crucible 14. Moreover, the rotation speed may be fixed or variable. The seed shaft 30 gradually goes up while rotating. At this moment, an SiC single crystal is formed and grows on the surface of the SiC seed crystal 36 which is in contact with the Si—C solution 16. It is noted that the seed shaft 30 may go up without rotating. Furthermore, the seed shaft 30 may neither go up, nor rotate.

In the method for producing an SiC according to the present embodiment, since a coolant gas flows in the seed shaft 30, the SiC seed crystal 36 is efficiently cooled. This makes the Si—C solution 16 in the vicinity of the SiC seed crystal 36, which is brought into contact with the solution, to be easily supercooled. Consequently, the SiC single crystal becomes easier to grow on the SiC seed crystal 36, thereby increasing the crystal growth rate.

[Application Examples 1 and 2 of First Embodiment]

Figure 4:
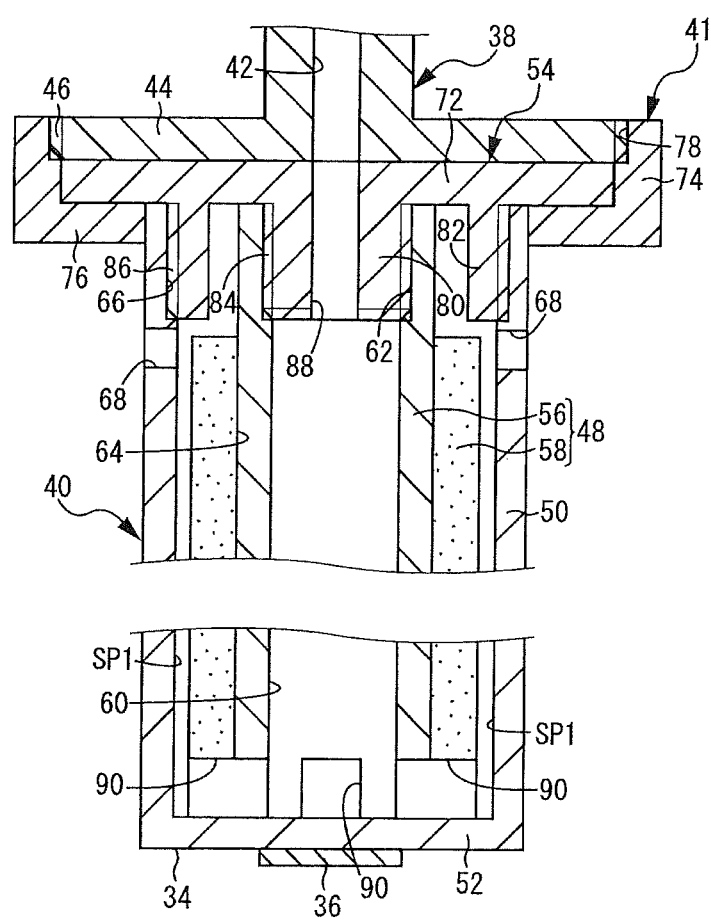
FIG. 4 is a longitudinal sectional view of a seed shaft included in a production apparatus of an SiC single crystal according to an application example 1 of the first embodiment of the present invention.

In the seed shaft 30 shown in FIG. 2, the lower end surface of the inner pipe 48 (the lower end surfaces of the base pipe 56 and the heat insulation pipe 58) is spaced apart from the upper surface of the bottom portion 52. However, the lower end surface of the inner pipe 48 may be in contact with the upper surface of the bottom portion 52. For example, as shown in FIG. 4, the lower end surface of the inner pipe 48 is in contact with the upper surface of the bottom portion 52. One or more communication portions 90 are formed at a lower end portion of the inner pipe 48. In this case, the gas after use which has taken away the heat of the bottom portion 52 flows from the introduction passage 60 into the discharge passage SP1 through the communication portion 90 (application example 1).

Figure 5:
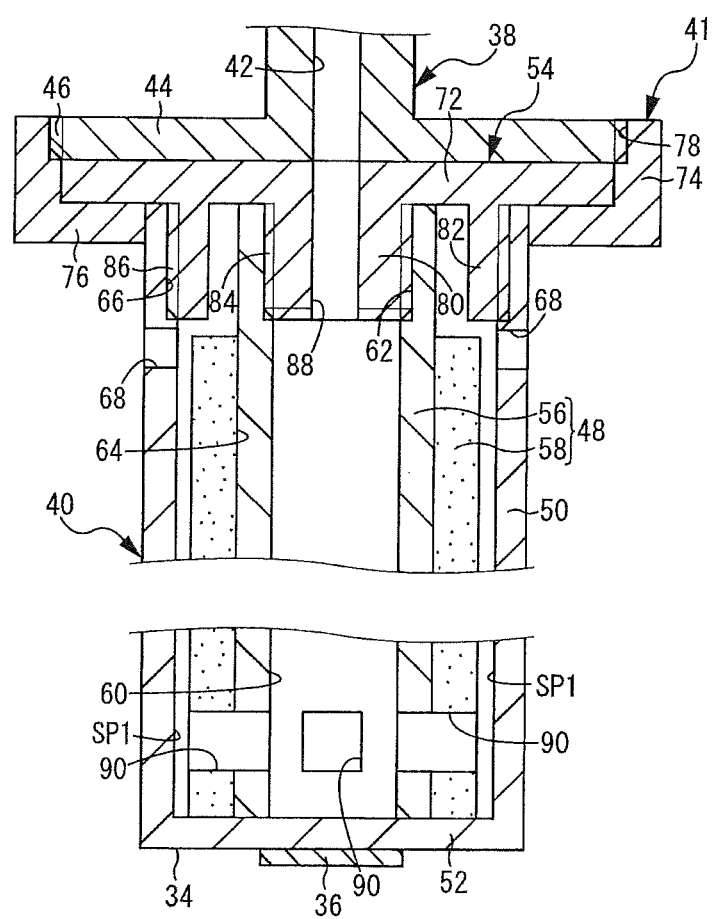
FIG. 5 is a longitudinal sectional view of a seed shaft included in a production apparatus of an SiC single crystal according to an application example 2 of the first embodiment of the present invention.

As shown in FIG. 5, the communication portion 90 may be formed above the lower end of the inner pipe 48 (application example 2).

[Application Example 3 of First Embodiment]

Figure 6:
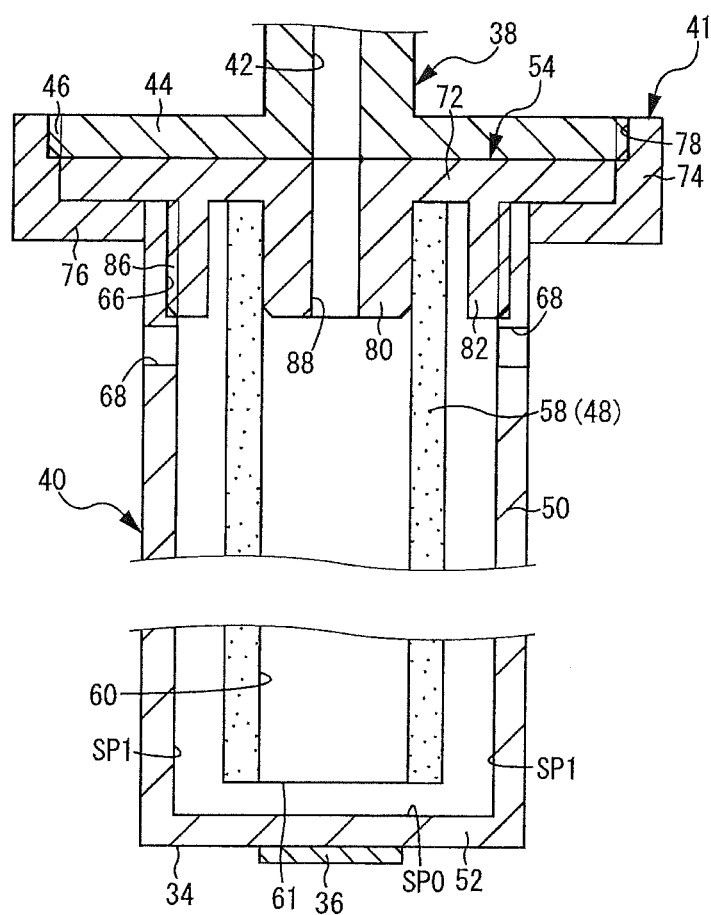
FIG. 6 is a longitudinal sectional view of a seed shaft included in a production apparatus of an SiC single crystal according to an application example 3 of the first embodiment of the present invention.

In the seed shaft 30 shown in FIG. 2, the inner pipe 48 includes the base pipe 56 and the heat insulation pipe 58. However, the configuration of the inner pipe 48 will not be limited to such a configuration. As shown in FIG. 6, the inner pipe 48 may be made up of the heat insulation pipe 58 alone.

[Second Embodiment]

Figure 7:
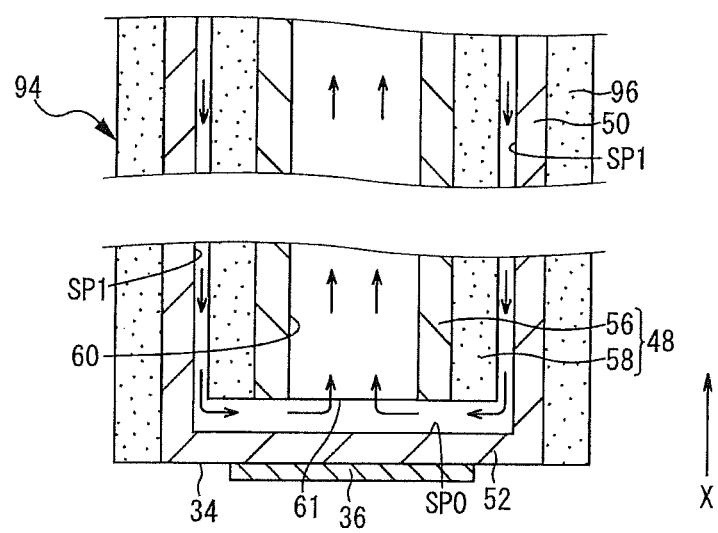
FIG. 7 is a longitudinal sectional view of a seed shaft included in a production apparatus of an SiC single crystal according to a second embodiment of the present invention.

As shown in FIG. 7, a production apparatus of the second embodiment includes a shaft 94 in place of the shaft 40. Other configurations of the production apparatus according to the second embodiment are the same as those of the production apparatus 10. The shaft 94 is different in the flow of coolant gas compared to the shaft 40.

In the shaft 94, a hole 60 is a discharge passage (a first passage) through which the gas after use flows, and a gap SP1 is an introduction passage (a second passage) through which the gas before use flows. In this case, configuration may be such that viewed from the axial direction X, a region of not less than 60% of the SiC seed crystal 36 overlaps a region inside the outer pipe 50.

In the shaft 94, a heat insulation member 96 is disposed on an outer peripheral surface of the outer pipe 50. This makes it possible, even if the gas before use flows through the gap SP1, to prevent the atmosphere around the outer pipe 50 from being excessively cooled.

EXAMPLES

Two production apparatuses (first and second production apparatuses) were prepared to produce an SiC single crystal by utilizing each production apparatus. Each of the first and second production apparatuses had the configuration shown in FIG. 2. The inner diameter of the inner pipe of the seed shaft of the first production apparatus was different from that of the inner pipe of the seed shaft of the second production apparatus. To be specific, the inner diameter of the inner pipe of the first production apparatus was 20 mm, and the inner diameter of the inner pipe of the second production apparatus was 8 mm. Other configurations of the first production apparatus was the same as those of the second production apparatus. Each of the diameters of the SiC seed crystals used in the first and second production apparatuses was 25 mm.

The left-hand side of Formula (1) was defined as $F=S_2/S_1$. The F value of the first production apparatus was 0.64 and satisfied Formula (1). On the other hand, the F value of the second production apparatus was 0.10, and did not satisfy Formula (1).

In the first and second production apparatuses, SiC single crystals were produced. At this moment, Si—C solutions having the same chemical composition were used in each of the production apparatuses. The temperature of the Si—C solution during the production of a single crystal was 1950° C. The flow rate of a coolant gas was 7.5 to 10 L/min. The crystal growth time was 10 hours.

After an SiC single crystal was produced, the crystal growth rate of an SiC single crystal in each production apparatus was determined by the following method. First, optical microscope photograph (magnification of 100 times) of a longitudinal section of a grown SiC single crystal was taken. A growth thickness of the SiC single crystal was measured from the optical microscope photograph. A crystal growth rate (μm/hr) was determined by dividing the growth thickness by a growth time.

[Test Result]

The crystal growth rate in the first production apparatus was 55 μm/hr. On the other hand, the crystal growth rate in the second production apparatus was 34 μm/hr, and was significantly smaller than in the first production apparatus which satisfied Formula (1).

Although, embodiments of the present invention have been described in detail, these are merely by way of example, and the present invention will not be limited in any way by the above described embodiments.

For example, in the first and second embodiments, an SiC seed crystal 36 having a block shape may be adopted. This will make it possible to prevent the bottom portion 52 (the lower end surface 34 of the seed shaft 30) with the SiC seed crystal 36 attached, from coming into contact with the Si—C solution 16.

The shapes or the like of the SiC seed crystal 36, the inner pipe 48, and the outer pipe 50 are not limited to those of the first and second embodiments, provided that Formula (1) is satisfied.

The invention claimed is:

1. A method for producing an SiC single crystal, comprising the steps of:
    providing a production apparatus of an SiC single crystal, the production apparatus comprising a crucible accommodating a raw material of an Si—C solution, and a seed shaft having a lower end surface to which an SiC seed crystal is to be attached,
    wherein the seed shaft extending in a height direction of the crucible comprises: an inner pipe constituting a first passage thereinside;
    the inner pipe including:
    a) a base pipe and a heat insulation pipe disposed on an outer peripheral surface of the base pipe, the heat insulation pipe being made of one or more selected from the group consisting of alumina, zirconia, pyrolytic carbon, and graphite sheet, or
    (b) being composed of a heat insulation pipe, the heat insulation pipe being made of one or more selected from the group consisting of alumina, zirconia, pyrolytic carbon, and graphite sheet;
    an outer pipe accommodating the inner pipe and constituting a second passage between itself and the inner pipe; and a bottom portion covering a lower end opening of the outer pipe and having the lower end surface, wherein one of the first and second passages serves as an introduction passage through which a coolant gas flows downward, and the other passage serves as a discharge passage through which the coolant gas flows upward;
    attaching the SiC seed crystal to the lower end surface such that when viewed from an axial direction of the seed shaft, a region of not less than 60% of the SiC seed crystal overlaps a region inside the inner pipe, the region inside the inner pipe being an empty space;
    producing an Si—C solution by heating the crucible;
    bringing the SiC seed crystal into contact with the Si—C solution; and
    growing an SiC single crystal on the SiC seed crystal while flowing the coolant gas in the seed shaft.

2. The method for producing an SiC single crystal according to claim 1, wherein a lower end of the inner pipe is disposed apart from the bottom portion.

* * * * *